United States Patent [19]

Sanwo et al.

[11] Patent Number: 5,019,728
[45] Date of Patent: May 28, 1991

[54] HIGH SPEED CMOS BACKPANEL TRANSCEIVER

[75] Inventors: Ikuo J. Sanwo, San Marcos, Calif.; James A. Donahue, Great Falls, Mont.

[73] Assignee: NCR Corporation, Dayton, Ohio

[21] Appl. No.: 580,017

[22] Filed: Sep. 10, 1990

[51] Int. Cl.⁵ .......................................... H03K 19/092
[52] U.S. Cl. ................................... 307/475; 307/443; 307/451
[58] Field of Search ............... 307/443, 451, 468, 469, 307/264, 475

[56]  References Cited

U.S. PATENT DOCUMENTS

| | | | |
|---|---|---|---|
| 4,216,390 | 8/1980 | Stewart | 307/264 |
| 4,242,604 | 12/1980 | Smith | 307/251 |
| 4,605,864 | 8/1986 | Varadarajan et al. | 307/270 |
| 4,694,202 | 9/1987 | Iwamura et al. | 307/475 |
| 4,698,526 | 10/1987 | Allan | 307/475 |
| 4,707,623 | 11/1987 | Bismarck | 307/475 |
| 4,709,162 | 11/1987 | Braceras et al. | 307/475 |
| 4,730,132 | 3/1988 | Watanabe et al. | 307/446 |
| 4,733,105 | 3/1988 | Shin et al. | 307/264 |
| 4,760,292 | 7/1988 | Bach | 307/443 |
| 4,779,015 | 10/1988 | Erdelji | 307/475 |
| 4,782,250 | 11/1988 | Adams et al. | 307/473 |
| 4,806,794 | 2/1989 | Walters, Jr. | 307/451 |
| 4,825,101 | 4/1989 | Walters, Jr. | 307/270 |
| 4,849,660 | 7/1989 | Hayashi et al. | 307/475 |
| 4,855,623 | 8/1989 | Flaherty | 307/475 |
| 4,857,770 | 8/1989 | Partoui et al. | 307/451 |
| 4,890,051 | 12/1989 | Kim et al. | 323/313 |
| 4,928,023 | 5/1990 | Marshall | 307/443 |

*Primary Examiner*—David Hudspeth
*Assistant Examiner*—Scott A. Ouellette
*Attorney, Agent, or Firm*—Wilbert Hawk, Jr.; Stephen F. Jewett; Gregory P. Gadson

[57]  ABSTRACT

In a high speed complementary metal-oxide-semiconductor (CMOS) inter-integrated circuit (IC) chip communication system, transmission line voltage swings between logic high and logic low levels are reduced by defining minimum and maximum bus voltages which lie between CMOS logic levels, thus lowering bus transition and hence data transfer times. The system is versatile, and does not involve typical emitter-coupled logic (ECL) logic levels. Transceivers interfacing between IC chips and the backpanel transmit data in the reduced logic level range on a pre-charged transmission line, and receive and convert data back to CMOS levels. A limiting transistor in the transmitter portion of the transceiver limits logic low level of the transmission line. The receiver portion of the transceiver converts the voltages received to CMOS levels with the aid of a differential (sense) amplifier.

14 Claims, 2 Drawing Sheets

HIGH SPEED CMOS BACKPANEL TRANSCEIVER

FIELD OF THE INVENTION

The present invention generally relates to computer data transfer systems, and more particularly to means for increasing the data transfer speed of data buses suitable for use in microprocessor chips.

BACKGROUND OF THE INVENTION

Integrated circuit (AC) chips using complementary metal-oxide-semiconductor (CMOS) technology have advantages when compared to those using emitter-coupled logic (ECL) technology. Among the advantages are lower power consumption and hence lower cooling requirements, and lower construction cost. However, CMOS chips are inferior to ECL chips in both intra-chip and inter-chip (backpanel) operation speeds. The aforementioned advantages of ECL chips are mainly due to a lower voltage swing between logic low and logic high levels ($-1.7$ to $-0.9$ volts for ECL, 0 to 5 volts for CMOS), and fewer transmission line effects resulting from impedance matching.

Prior art CMOS data transfer systems exist for intra-chip communication which limit data bus swings to ECL levels, and employ CMOS-to-ECL converters, and vice versa. What is desired is a CMOS inter-chip data transfer system which not only limits voltage swings to increase data transfer speed, but which is also operable at logic levels other than the standard ECL levels (but falling between the CMOS levels), according to design choice.

SUMMARY OF THE INVENTION

It is an object of the present invention to provide an inter-AC chip data transfer system with high data transfer speed.

It is also an object of the present invention to decrease data bus voltage swings.

It is a further object of the present invention to provide a minimum bus voltage and a maximum bus voltage, both of which fall between the AC chip logic high and logic low voltage levels.

It is another object of the present invention to provide such a restricted voltage swing system with a device for converting the bus voltages to the correct logic levels.

An additional object of the present invention is to implement such a data transfer system using complementary metal-oxide-semiconductor (CMOS) technology.

It is yet another object of the present invention to implement a data transfer system meeting the above objects using microprocessor chips.

A further object of the present invention is to implement the above objects without the need for a significant increase in circuitry.

There is provided in accordance with the present invention, a high speed inter-AC chip data transceiver for, via a data transfer bus, transferring data between AC chips which internally utilize signals at first and second logic levels including:

pre-charge means for pre-charging the data transfer bus to a third logic level; and pull-down means for pulling the data transfer bus down to a fourth logic level;

wherein the voltage swing between the third and fourth logic levels is lower than the voltage swing between the first and second logic levels.

The details of the present invention will be revealed in the following description with reference to the aforementioned drawings.

BRIEF DESCRIPTION OF THE DRAWING

The drawing FIGS. 1(a-b) is a detailed schematic diagram of the preferred embodiment of the present inventive data transfer system.

DESCRIPTION OF THE PREFERRED EMBODIMENT

Figure 1A:
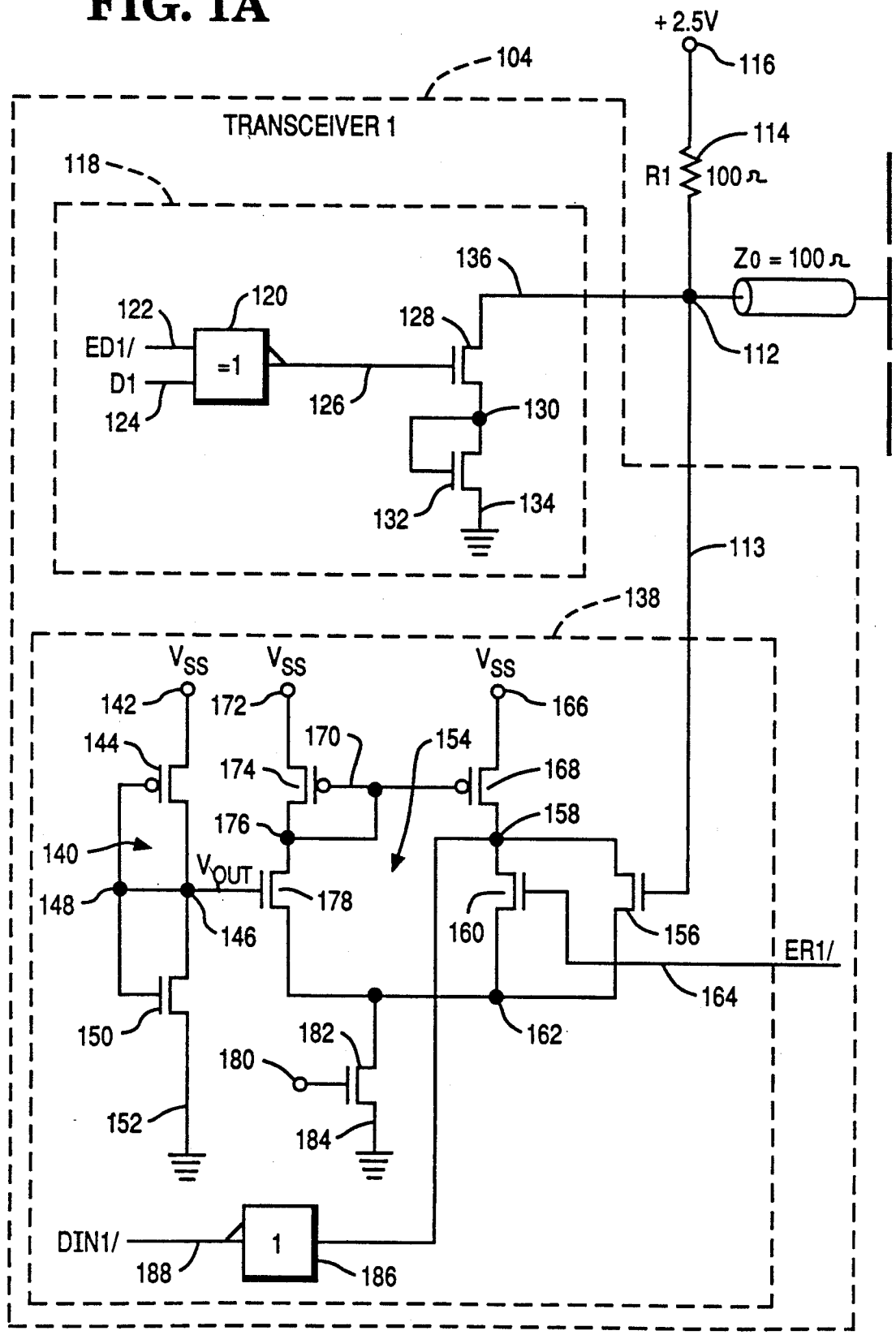
Figure 1B:
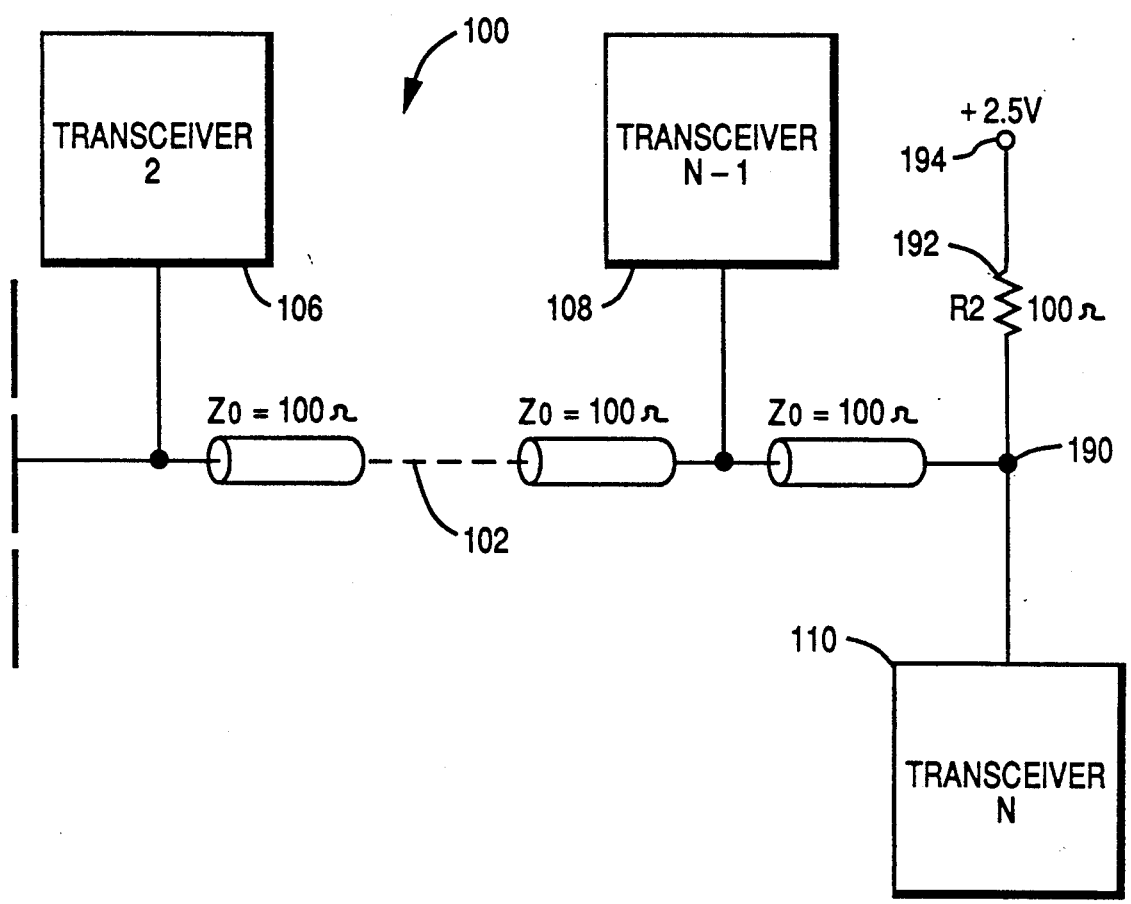

The drawing FIGS. 1(a-b) shows shows the preferred embodiment for a high speed inter-AC chip data transfer system 100 implemented using CMOS technology and having a data transfer bus or transmission line 102 that transfers data in the form of logic high and logic low voltages. All transistors are of the junction field-effect type (JFET), with a bubble at the gate indicating a p-channel device, and the absence of a bubble at the gate indicating an n-channel device. A group of presently inventive identical transceivers 104, 106, 108 and 110 capable of transmitting and receiving data signals, connect to the transmission line 102, which transmission line has a characteristic impedance $Z_0$ of 100 ohms, for example. The number of transceivers included in the system 100 is a matter of design choice. Since all of the transceivers are identical, only the one numbered 104 will be described in detail.

The logic levels on the transmission line 102 are 2.5 volts for logic high, and 1.6 volts for logic low, in the preferred embodiment. This allows for low voltage swings, and hence faster transmission line transition times between the two logic states. Recall that this differs from the normal ECL logic levels of $-0.9$ volts and $-1.7$ volts.

The transceiver 104 is connected to the transmission line 102 at a node 112, and is terminated by a 100 ohm resister 114. The resistor (R1) 114 is connected to a voltage terminal 116 which is in turn connected to a 2.5 volt voltage source. The voltage source at 116 acts as a transmission line pre-charger to pre-charge the transmission line 102 to 2.5 volts. A node 190, resistor (R2) 192 and a terminal 194 at the other end of the transmission line 102 also serve to terminate the transmission line, and are identical in function to elements 112, 114 and 116, respectively.

By terminating the transceivers in the transmission line characteristic impedance as described above, data signal reflections and "ringing" are eliminated. In addition to the low voltage swings, the impedance matching further increases the data transfer speed.

The two major components of the transceiver 104 are a transmitter 118 and a receiver 138. All voltage sources internal to the transceivers are at the CMOS levels—i.e., 5 volts representing the logic high level, and 0 volts representing the logic low level. A logical NOR gate 120 along with two transistors 128 and 132 make up the transmitter 118. The input signals to the NOR gate 120 are an "enable data" signal ED1/ (active low) on input line 122, and "data" signal D1 on the input line 124. When the signal ED1/ is high, the NOR gate 120 outputs a low signal over the line 126 to the transistor 128. This in turn keeps the transistor 128 off (non-conducting) so that the transmitter 118 is off. Thus, the transmission line 102 is at the relative logic high level of 2.5 volts, and transceivers other than the one numbered 104 are free to send data over the transmission line 102.

When the signal ED1/ is low, however, the output of the transmitter is directly related to the signal D1. (If D1 is a logic high signal—5 volts—the the output of the transmitter is a relative logic high signal—2.5 volts; if D1 is logic low signal—0 volts—the output of the transmitter is a relative logic low signal—1.6 volts.) This action is accomplished as follows. When D1 is a logic high signal the transistor 128 stays in the non-conducting state; therefore the transmission line 102 stays at the relative logic high level. When D1 is a logic low signal, the transistor 128 assumes the conducting state. Transistor 132 is connected at its gate and drain to the node 130, and at its source to ground at 134. Initially, the 2.5 volts being passed by the transistor 128 causes the transistor 132 to conduct, thereby pulling down the transmission line voltage. Transistor 132 is sized such that as the voltage passing therethrough is lowered by the pull-down effect, it ceases to conduct at 1.6 volts rather than 0 volts. Therefore, the transmission line voltage cannot fall below 1.6 volts in the preferred embodiment.

The receiver 138 has a reference voltage generator 140 and a differential receiver or amplifier 154. The reference voltage generator 140 consists of a transistor pair 144, 150 which generates a reference or threshold voltage $V_{out}$ on line 146 in a manner well-known in the art. As can be seen from the figure, the transistor 144 is connected to a voltage source $V_{ss}$ at terminal 142, and transistor 150 is connected to ground at 152. The threshold voltage is 2 volts in the preferred embodiment, which is approximately at the center of the transmission line voltage swing. That is to say, all voltages received from the transmission line which are greater than 2 volts are presumed to reflect logic high signals, and all voltages received from the transmission line which are below 2 volts are presumed to reflect logic low signals.

The threshold voltage $V_{out}$ is calculated using the equations below:

$$V_{out} = (V_{DD} + V_{tp} + V_{tn} \cdot \sqrt{(\beta_n/\beta_p)}) / (1 + \sqrt{(\beta_n/\beta_p)}) \quad (1)$$

$$\beta = (\mu \cdot \epsilon/t_{ox})/(W/L) \quad (2)$$

$$\beta_n/\beta_p = (W_n\mu_n)/(W_p\mu_p) = 2 \cdot W_n/W_p \quad (3)$$

$$V_{out} = (V_{DD} + V_{tp} + V_{tn} \cdot \sqrt{(2 \cdot W_n/W_p)}) / (1 + \sqrt{(2 \cdot W_n/W_p)}) \quad (4)$$

where $V_{DD}$ is the supply voltage, $V_{tp}$ is the p-channel transistor threshold voltage, $V_{tn}$ is the n-channel transistor threshold voltage, $\beta$ is the gain, $\beta_p$ is the gain of the p-channel transistor, $\beta_n$ is the gain of the n-channel transistor, $\mu$ is the mobility of the charge carriers, $\mu_p$ is the p-channel transistor charge carrier mobility, $\mu_n$ is the n-channel transistor charge carrier mobility, $\epsilon$ is the gate permeability, $t_{ox}$ is the gate oxide thickness, W is the channel width, $W_p$ is the channel width of the p-channel transistor, $W_n$ is the channel width of the n-channel transistor, and L is the channel length.

Substituting $V_{DD}=5$ volts, $V_{tp}=-1.2$ volts, $V_{tn}=0.8$ volts, $W_n=16$ microns, and $W_p=12$ microns, then $V_{out}=2.0$ volts, as desired.

The threshold voltage $V_{out}$ is supplied to the differential receiver 154, primarily consisting of transistors 156, 160, 168, 174, 178, and 182, which differential receiver 154 compares the data signals received from the transmission line 102 via line 113 with the threshold value so that when the threshold is exceeded, the output of the receiver 154 is low, and when the threshold is not exceeded, the output of the receiver 154 is high. The transistors 168 and 174 are connected by their terminals 166 and 172, respectively, to a voltage source $V_{ss}$. The signal ER1/ (active low) is an "enable read" signal which enables the receiver 154 to receive data signals when it is active, and disables the receiver 154 when it is inactive.

In the enabled state, if the data signal received on line 113 is below the threshold the transistor 156 is turned off, while the transistor 178 is turned on by the threshold voltage. The output of the receiver is at a node 158. The conduction of transistor 178 pulls the gate voltage of the transistor 168 low via node 176 and line 170, thereby causing the transistor 168 to turn on. Thus 5 volts ($V_{ss}$) connected to the terminal 166 is passed by the transistor 168 to the output node 158.

When the data signal received on line 113 is above the threshold, the transistor 156 turns on to pull the output node 158 low, while the transistors 178 and 168 are turned off. It should be noted that when ER1/ is inactive the transistor 160 conducts to pull the output node 158 low. This means that when the receiver is disabled it produces a constant logic low output. The transistor 182 is a current limiter which limits the amount of current which can flow through the transistors 156, 160 and 178.

In addition to inverting the output of the receiver 154, an inverter 186 also aids in driving low voltages which are below approximately 0.9 volts, because of limitations of the preferred embodiment of the receiver. The inverter is connected to the output line 188 of the receiver 154, which is also the output line of the transceiver 104. The data signals output by the receiver 138 are designated "DIN1" in the drawing.

Variations and modifications to the present invention are possible given the above disclosure. However, such variations and modifications are intended to be within the scope of the invention claimed by this letters patent. For example, a voltage other than 2.5 volts can be used to pre-charge the transmission line. Also, the transistor 132 can be sized such that it cuts off at a voltage other than 1.6 volts. Additionally, the threshold voltage generated by the reference voltage generator can be different from the 2 volts disclosed if the voltage swing on the transmission line is other than that for the preferred embodiment.

We claim:

1. A high speed inter-integrated circuit (AC) chip data transceiver for, via a data transfer bus, transferring data between AC chips which internally utilize signals at first and second logic levels comprising:
   pre-charge means for pre-charging said data transfer bus to a third logic level; and
   pull-down means for pulling said data transfer bus down to a fourth logic level;
   wherein the voltage swing between said third and fourth logic levels is lower than the voltage swing between said first and second logic levels.

2. The data transceiver in claim 1 wherein all said logic levels are of the same algebraic sign.

3. The data transceiver in claim 1 wherein said first and second logic levels represent the logic levels of complementary metal-oxide-semiconductor (CMOS) technology.

4. The data transceiver in claim 3 wherein said third and fourth logic levels substantially equal 2.5 volts and 1.6 volts, respectively.

5. The data transceiver in claim 1 wherein said pull-down means comprises a pass transistor which conducts during pull-down of said data transfer bus, and ceases to conduct when said data transfer bus reaches said fourth logic level.

6. The data transceiver in claim 1 further comprising a differential amplifier for receiving and converting data from said data transfer bus at said third and fourth logic levels, to said first and second logic levels.

7. The data transceiver in claim 1 further comprising:
a differential amplifier for receiving and converting data from said data transfer bus at said third and fourth logic levels, to said first and second logic levels;
wherein said pull-down means comprises a pass transistor which conducts during pull-down of said data transfer bus, and ceases to conduct when said data transfer bus reaches said fourth logic level; and
wherein said first, second, third and fourth logic levels substantially equal 5 volts, 0 volts, 2.5 volts and 1.6 volts, respectively.

8. A high speed inter-integrated circuit (AC) chip data transfer method for, via a data transfer bus, transferring data between AC chips which internally utilize signals at first and second logic levels comprising the steps of:
pre-charging said data transfer bus to a third logic level; and
pulling said data transfer bus down to a fourth logic level;
wherein the voltage swing between said third and fourth logic levels is lower than the voltage swing between said first and second logic levels.

9. The data transfer method in claim 8 wherein all said logic levels are of the same algebraic sign.

10. The data transfer method in claim 8 wherein said first and second logic levels represent the logic levels of complementary metal-oxide-semiconductor (CMOS) technology.

11. The data transfer method in claim 10 wherein said third and fourth logic levels substantially equal 2.5 volts and 1.6 volts, respectively.

12. The data transfer method in claim 8 wherein said pull-down step comprises the step of allowing a pass transistor to conduct during pull-down of said data transfer bus, and not allowing said pass transistor to conduct when said data transfer bus reaches said fourth logic level.

13. The data transceiver in claim 8 further comprising the step of receiving and converting data from said data transfer bus at said third and fourth logic levels, to said first and second logic levels with a differential amplifier.

14. The data transceiver in claim 8 further comprising the step of:
receiving and converting data from said data transfer bus at said third and fourth logic levels, to said first and second logic levels with a differential amplifier;
wherein said pull-down step comprises allowing a pass transistor to conduct during pull-down of said data transfer bus, and not allowing said pass transistor to conduct when said data transfer bus reaches said fourth logic level; and
wherein said first, second, third and fourth logic levels substantially equal 5 volts, 0 volts, 2.5 volts and 1.6 volts, respectively.

* * * * *

UNITED STATES PATENT AND TRADEMARK OFFICE
CERTIFICATE OF CORRECTION

PATENT NO. : 5,019,728

DATED : May 28, 1991

INVENTOR(S) : Ikuo J. Sanwo et al.

It is certified that error appears in the above-identified patent and that said Letters Patent is hereby corrected as shown below:

IN THE SPECIFICATION

Please replace AC with IC every place it appears.

IN THE CLAIMS

Please replace AC with IC every place it appears.

Signed and Sealed this

Third Day of September, 1991

Attest:

HARRY F. MANBECK, JR.

Attesting Officer

Commissioner of Patents and Trademarks